(12) United States Patent  
Oikawa

(10) Patent No.: US 8,169,054 B2
(45) Date of Patent: May 1, 2012

(54) SEMICONDUCTOR DEVICE AND METHOD OF MANUFACTURING THE SAME

(75) Inventor: Takahiro Oikawa, Gunma (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 424 days.

(21) Appl. No.: 11/785,909

(22) Filed: Apr. 20, 2007

(65) Prior Publication Data

US 2007/0249163 A1 Oct. 25, 2007

(30) Foreign Application Priority Data

Apr. 21, 2006 (JP) ................................. 2006-117833
Mar. 27, 2007 (JP) ................................. 2007-081955

(51) Int. Cl.
*H01L 29/40* (2006.01)

(52) U.S. Cl. . 257/621; 257/751; 257/774; 257/E21.538; 257/E21.553; 438/700

(58) Field of Classification Search .................. 438/700, 438/627, 637; 257/E21.553, E21.577, E21.584, 257/E21.585, E21.538
See application file for complete search history.

(56) References Cited

U.S. PATENT DOCUMENTS

| 6,555,461 | B1 | 4/2003 | Woo et al. | |
| 6,566,247 | B2 * | 5/2003 | Stumborg et al. | 438/627 |
| 2002/0170173 | A1 * | 11/2002 | Mashino | 29/852 |
| 2004/0094838 | A1 * | 5/2004 | Seo et al. | 257/750 |
| 2004/0137714 | A1 * | 7/2004 | Friedemann et al. | 438/627 |
| 2005/0006783 | A1 * | 1/2005 | Takao | 257/774 |
| 2005/0048767 | A1 | 3/2005 | Matsumoto | |
| 2005/0118796 | A1 * | 6/2005 | Chiras et al. | 438/618 |
| 2005/0248002 | A1 * | 11/2005 | Newman et al. | 257/621 |
| 2005/0255691 | A1 * | 11/2005 | Ding et al. | 438/627 |
| 2005/0269704 | A1 * | 12/2005 | Kameyama et al. | 257/751 |
| 2006/0024953 | A1 * | 2/2006 | Papa Rao et al. | 438/629 |
| 2006/0051959 | A1 * | 3/2006 | Iwatake et al. | 438/643 |

FOREIGN PATENT DOCUMENTS

| EP | 1 385 202 | 1/2004 |
| EP | 1 564 806 | 8/2005 |
| JP | 06-302543 | 10/1994 |
| JP | 2002-118109 | 4/2002 |
| KR | 10-2005-0039132 | 4/2005 |
| WO | WO/99-27579 | 6/1999 |

OTHER PUBLICATIONS

European Search Report mailed Aug. 14, 2007, directed at counterpart EP application No. 07008082.5; 7 pages.

* cited by examiner

*Primary Examiner* — Julia Slutsker
(74) *Attorney, Agent, or Firm* — Morrison & Foerster LLP

(57) ABSTRACT

The invention is directed to a semiconductor device having a via hole and a method of manufacturing the same that achieve both the prevention of a barrier layer insufficiently covering the via hole and the control of via resistance at the same time. A semiconductor substrate having a pad electrode on its front surface is prepared. The semiconductor substrate is etched from its back surface to its front surface to form a via hole exposing the pad electrode. A first barrier layer is then formed in the via hole by a sputtering method or a PVD method and reverse-sputtering (etching). By this reverse-sputtering, the barrier layer on the bottom of the via hole is removed to expose the pad electrode. A second barrier layer is then formed on the pad electrode exposed in the via hole. The via resistance is controlled by adjusting only the thickness of the second barrier layer.

9 Claims, 12 Drawing Sheets

SEMICONDUCTOR DEVICE AND METHOD OF MANUFACTURING THE SAME

CROSS-REFERENCE OF THE INVENTION

This invention claims priority from Japanese Patent Application Nos. 2006-117833 and 2007-81955, the contents of which are incorporated herein by reference in their entireties.

BACKGROUND OF THE INVENTION

1. Field of the Invention

The invention relates to a semiconductor device and a method of manufacturing the same, particularly to a semiconductor device having a via hole and a method of manufacturing the same.

2. Description of the Related Art

Conventionally, a lower conductor (a wiring layer formed on a substrate or a diffusion layer) and an upper conductor corresponding thereto are electrically connected by providing an opening (hereafter, referred to as a via hole) reaching the lower conductor in a semiconductor substrate or an insulation film deposited on a surface of a semiconductor substrate and providing metal (copper, aluminum or tungsten) as a wiring in this via hole. The via hole is also called a through hole or a contact hole.

An example of a conventional method of manufacturing a semiconductor device having such a via hole will be described referring to figures. FIGS. 14 to 16 are schematic cross-sectional views showing the manufacturing process in due order.

As shown in FIG. 14, a semiconductor substrate 100 made of silicon or the like is prepared. A pad electrode 101 as a lower conductor is provided on the front surface of the semiconductor substrate 100. Then, a via hole 102 is formed by etching so as to penetrate the semiconductor substrate 100 from the front surface to the back surface and expose the pad electrode 101. A first insulation film (e.g. a silicon oxide film) 103 covering the front surface of the semiconductor substrate 100 and a passivation film (e.g. a silicon nitride film) 104 covering the pad electrode 101 at least partially are formed. A glass substrate 106 as a supporting body is attached on the front surface of the semiconductor substrate 100 with an adhesive layer 105 made of epoxy resin or the like interposed therebetween.

Then, a second insulation film 107 (e.g. a silicon oxide film or a silicon nitride film) is formed on the back surface of the semiconductor substrate 100 including in the via hole 102 by, for example, a CVD method. Then, the second insulation film 107 on the bottom of the via hole 102 is removed by etching to expose a part of the pad electrode 101.

Then, as shown in FIG. 15, a barrier layer 108 is formed in the via hole 102. This barrier layer 108 preferably has low resistance and is made of a titanium (Ti) layer or a titanium nitride (TiN) layer, for example.

While the CVD method (the chemical vapor deposition method) is one of methods of forming the barrier layer 108, there is a strong possibility that an impurity is mixed in the film by the CVD method to cause degradation of film quality such as reduction of conductivity. Furthermore, the CVD method also has problems that the running cost of its device itself and a material is significantly high and the process is unstable.

Therefore, it is preferable to use a sputtering method for forming the barrier layer 108 since it is simpler and more stable and provides the lower running cost and less possibility of the film quality degradation than the CVD method.

However, since the sputtering method sometimes forms a film insufficiently covering the sidewall and bottom (particularly, a corner portion) of the via hole 102, the film deposition by the sputtering method need be performed enough as shown in FIG. 15 in order to address this problem. Therefore, it is inevitable that the barrier layer 108 on the back surface of the substrate and the bottom of the via hole 102 is thickened.

Alternatively, the coverage of the barrier layer 108 on the bottom and sidewall of the via hole 102 is enhanced by performing reverse-sputtering (etching) to the barrier layer 108 formed by the sputtering method first to scatter the barrier layer 108 deposited on the bottom of the via hole 102 therearound (e.g. Japanese Patent Application Publication No. H6-302543) as shown in FIG. 16.

As described above, the barrier layer 108 is formed by the sputtering or the combination of the sputtering and the reverse-sputtering. Those techniques are described in Japanese Patent Application Publication Nos. H6-302543, 2002-118109 and 2001-524753.

However, when the sputtering is performed to excess, while the coverage of the barrier layer is enhanced, the barrier layer on the bottom of the via hole is formed too thick as shown in FIG. 15, thereby causing a problem that the resistance of an electrode formed in the via hole (hereafter, referred to as via resistance) is increased.

Furthermore, when the barrier layer is formed by the reverse-sputtering after the sputtering, the barrier layer on the bottom of the via hole has a thickness X (see FIG. 16) that is obtained by subtracting the thickness of the film removed by the reverse-sputtering (etching) from the thickness of the film formed by the sputtering method first. By this method, it is difficult to accurately control the thickness X of the ultimate barrier layer on the bottom of the via hole and the via resistance is not properly controlled.

The invention is directed to a semiconductor device and a method of manufacturing the same that achieve both the prevention of the barrier layer insufficiently covering the via hole and the control of the via resistance at the same time.

SUMMARY OF THE INVENTION

The features of the invention are as follows. The invention provides a method of manufacturing a semiconductor device, including: preparing a semiconductor substrate having a lower conductor on its front surface; removing a portion of the semiconductor substrate from its back surface to its front surface to form a via hole exposing the lower conductor; forming a first barrier layer in the via hole by a sputtering method or a PVD method; partially removing the first barrier layer deposited on a bottom of the via hole by reverse-sputtering to expose a surface of the lower conductor; forming a second barrier layer on the lower conductor exposed on the bottom of the via hole; forming a penetrating electrode on the second barrier layer in the via hole; and forming an upper conductor on the back surface of the semiconductor substrate, the upper conductor being electrically connected with the lower conductor through the penetrating electrode.

The invention also provides a method of manufacturing a semiconductor device having forming a via hole, including: forming a first barrier layer in the via hole by a sputtering method or a PVD method; partially removing the first barrier layer deposited on a bottom of the via hole by reverse-sputtering; forming a second barrier layer on the bottom of the via hole; and forming a penetrating electrode in the via hole.

In the method of the invention, the second barrier layer is formed by a sputtering method or a PVD method.

The method of the invention further includes forming a seed layer for forming the penetrating electrode by plating on the second barrier layer.

In the method of the invention, the forming of the seed layer includes forming a seed layer on the second barrier layer and reverse-sputtering the seed layer on the second barrier layer.

In the method of the invention, the second barrier layer is formed so that a thickness of a whole barrier layer including the first and second barrier layers is constant on the bottom and a sidewall of the via hole or smaller on the bottom of the via hole than on the sidewall of the via hole.

The invention also provides a method of manufacturing a semiconductor device, including: removing a portion of a semiconductor substrate to a middle of its thickness to form a via hole; forming a first barrier layer in the via hole by a sputtering method or a PVD method; partially removing the first barrier layer deposited on a bottom of the via hole by reverse-sputtering to expose the semiconductor substrate on the bottom of the via hole; forming a second barrier layer on the semiconductor substrate exposed on the bottom of the via hole; and forming an electrode in the via hole, the electrode being electrically connected with the second barrier layer.

The invention also provides a semiconductor device including: a lower conductor and an upper conductor provided with a semiconductor substrate interposed therebetween; a via hole electrically connecting the lower conductor and the upper conductor; a barrier layer formed in the via hole; and a penetrating electrode formed on the barrier layer in the via hole, wherein the barrier layer comprises a first barrier layer formed on an inner sidewall of the via hole by a sputtering process or a PVD process and a reverse-sputtering process and a second barrier layer formed on a bottom of the via hole by a process different from the processes for forming the first barrier layer.

The invention also provides a semiconductor device having a via hole including: a barrier layer formed in the via hole; and a penetrating electrode formed on the barrier layer in the via hole, wherein the barrier layer comprises a first barrier layer formed on an inner sidewall of the via hole by a sputtering process or a PVD process and a reverse-sputtering process and a second barrier layer formed on a bottom of the via hole by a process different from the processes for forming the first barrier layer.

In the semiconductor device of the invention, a seed layer is formed on the second barrier layer.

In the semiconductor device of the invention, a thickness of a whole barrier layer comprising the first and second barrier layers is constant on the bottom and the sidewall of the via hole or smaller on the bottom of the via hole than on the sidewall of the via hole.

DETAILED DESCRIPTION OF THE INVENTION

A first embodiment of the invention will be described referring to figures. FIGS. 1 to 11 are cross-sectional views showing a process of manufacturing a semiconductor device in due order.

Figure 1:
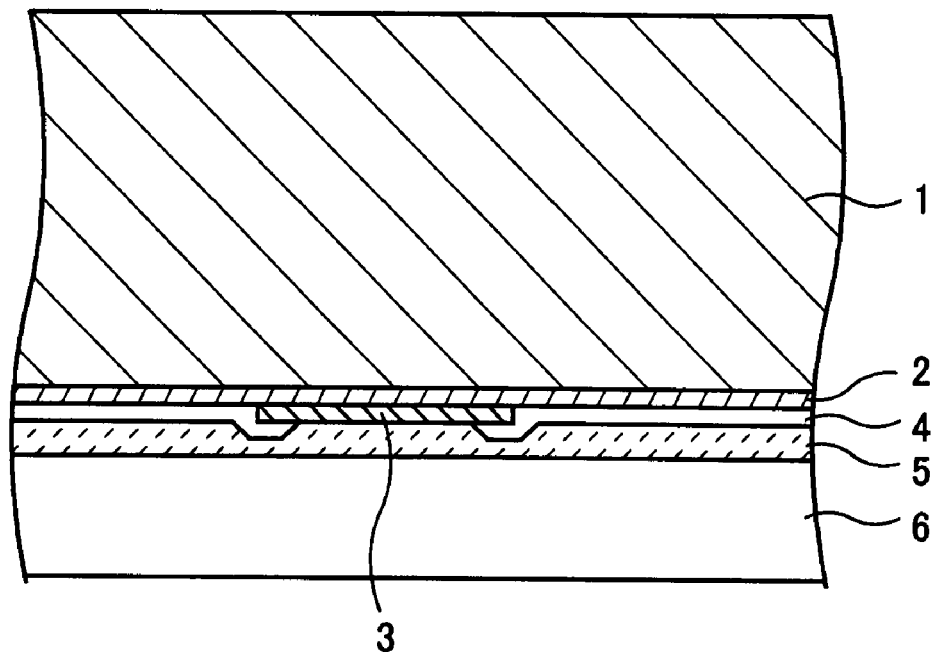
FIGS. 1 to 13 are cross-sectional views for explaining a semiconductor device and a method of manufacturing the same of a first embodiment of the invention.

First, as shown in FIG. 1, a semiconductor substrate 1 having an electronic device (e.g. a light receiving element such as CCD or an infrared ray sensor, a light emissive element or the other semiconductor element) (not shown) formed on its front surface is prepared. The semiconductor substrate 1 has a diameter of, for example, 8 inches (200 mm) and a thickness of about 300 to 700 µm. A first insulation film 2 (e.g. a silicon oxide film or a BPSG film formed by a thermal oxidation method or a CVD method) is formed on the front surface of the semiconductor substrate 1 so as to have a thickness of, for example, 2 µm.

Then, a metal layer made of aluminum (Al), an aluminum alloy or copper (Cu) is formed by a sputtering method, a plating method or the other deposition method, and this metal layer is patterned by etching using a resist layer (not shown) as a mask. By this process, a pad electrode 3 as an example of a lower conductor is formed on the first insulation film 2 to have a thickness of, for example, 1 µm. The pad electrode 3 is electrically connected with the electronic device on the semiconductor substrate 1 or a surrounding element thereof through a wiring (not shown).

Then, a passivation film 4 (e.g. a silicon nitride film) is formed on the front surface of the semiconductor substrate 1 by, for example, a CVD method so as to cover a portion of the pad electrode 3. Then, a supporting body 6 is attached on the front surface of the semiconductor substrate 1 including on the pad electrode 3 with an adhesive layer 5 made of an epoxy resin, a resist, an acrylic material or the like interposed therebetween. The supporting body 6 may be a film-like protection tape, a rigid substrate made of a glass, quartz, ceramic, plastic, metal or the like, or made of a resin. The rigid substrate is preferable as the supporting body 6 for firmly supporting the thinned semiconductor substrate 1 and automating its conveyance without manual conveyance. The supporting body 6 has both functions of supporting the semiconductor substrate 1 and protecting the surface of the semiconductor substrate 1 formed with the element.

Then, back-grinding is performed to the back surface of the semiconductor substrate 1 using a back surface grinder so as to grind the semiconductor substrate 1 into a predetermined thickness (e.g. about 100 µm). This grinding process may be etching or the combination of the grinder and the etching. There is also a case where the grinding process is not necessary depending on the application or specification of an end-product and the initial thickness of the prepared semiconductor substrate 1.

Figure 2:
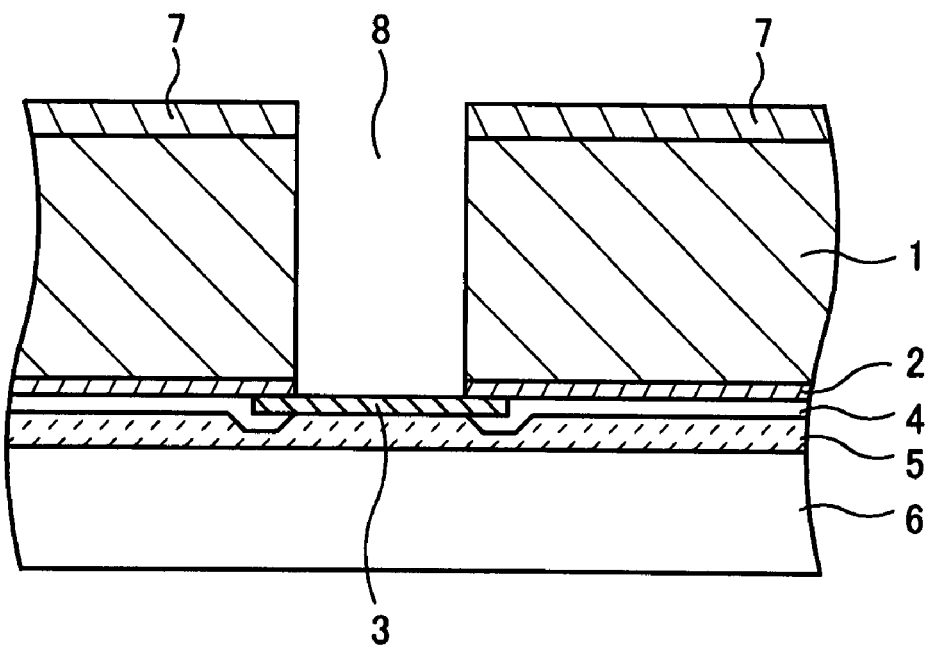

Then, as shown in FIG. 2, a resist layer 7 is selectively formed on the back surface of the semiconductor substrate 1. The resist layer 7 has an opening in a position corresponding to the pad electrode 3 on the back surface of the semiconductor substrate 1. Then, the semiconductor substrate 1 is etched using this resist layer 7 as a mask. By this etching, a via hole 8 is formed penetrating the semiconductor substrate 1 from its back surface to its front surface in a position corresponding to the pad electrode 3. The first insulation film 2 is exposed on the bottom of the via hole 8.

Then, etching is further performed using the resist layer 7 as a mask to remove the exposed first insulation film 2. The process of etching the first insulation film 2 is not necessarily performed at this time, and may be performed in the other etching process simultaneously. The diameter of the via hole 8 is about 30 to 50 μm, for example. Although the via hole 8 is formed into a straight shape in this embodiment, the via hole 8 may be formed into a tapered shape of which the diameter is gradually reduced from the back surface side to the front surface side of the semiconductor substrate 1.

Figure 3:
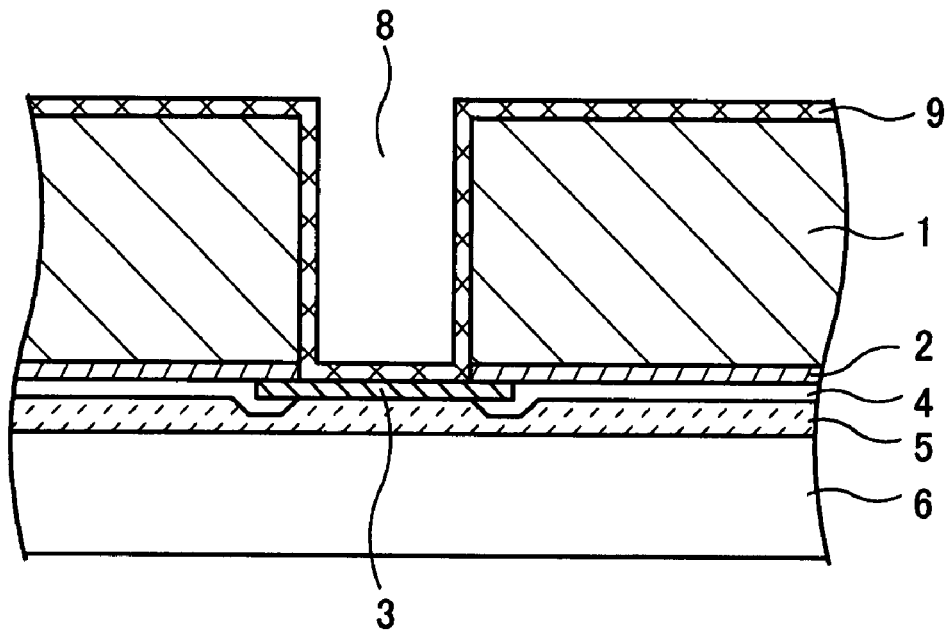

Then, as shown in FIG. 3, the resist layer 7 is removed and a second insulation film 9 (e.g. a silicon oxide film or a silicon nitride film formed by a CVD method) is formed on the whole back surface of the semiconductor substrate 1 including in the via hole 8.

Figure 4:
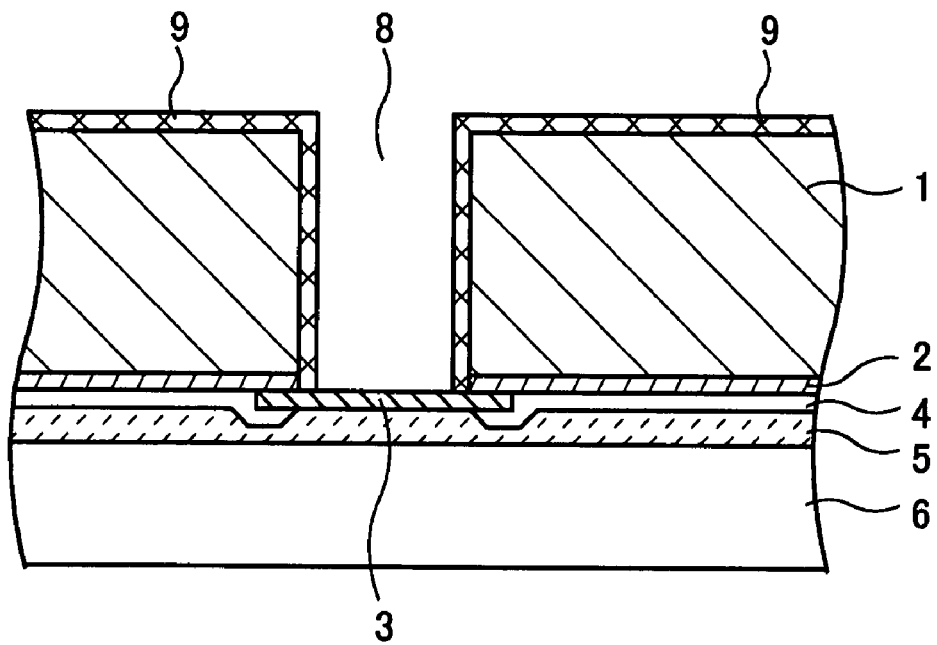

Then, as shown in FIG. 4, the second insulation film 9 on the bottom of the via hole 8 is removed by etching using a resist layer (not shown) as a mask. By this etching, a part of the pad electrode 3 is exposed. This etching may be performed without the mask by utilizing the tendency that the second insulation film 9 is formed thickest on the back surface of the semiconductor substrate 1 and thinner toward the sidewall and the bottom of the via hole 8. The etching without the mask streamlines the manufacturing process.

Figure 5:
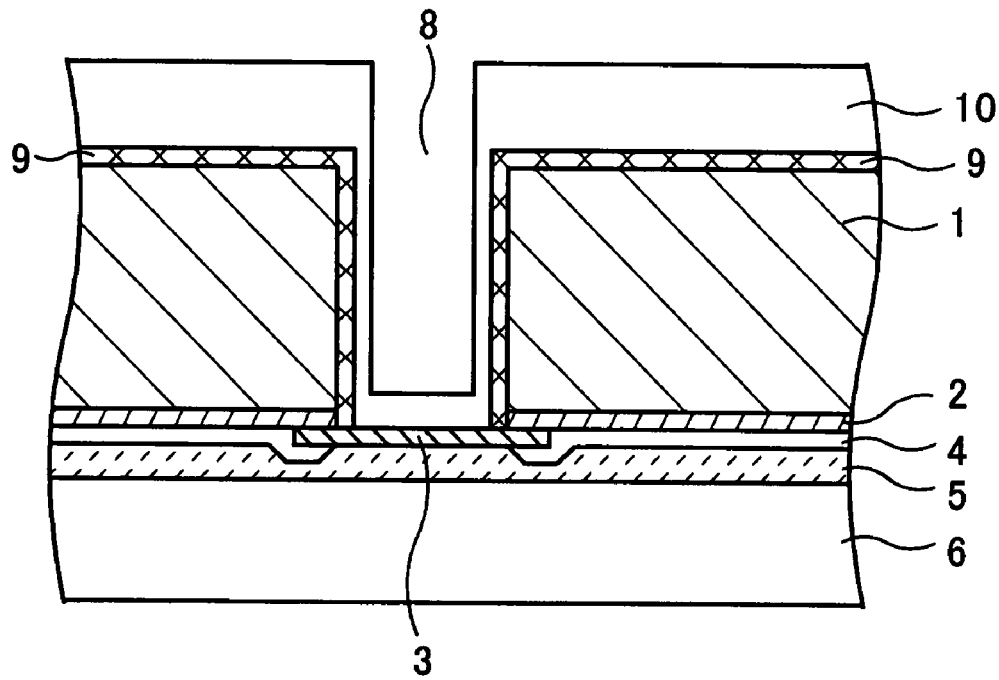

Then, as shown in FIG. 5, a barrier layer 10 is formed in the via hole 8 and on the back surface of the semiconductor substrate 1. At this time, although a CVD method may be used for forming the barrier layer 10, a sputtering method or a PVD method (a physical vapor deposition method) is preferable from an aspect of minimizing the reduction of conductivity and film quality. In detail, for example, the sputtering is performed with single wafer type sputtering equipment under the condition of chamber pressure of 2 Pa, an argon gas flow rate of 10 sccm, and RF power of 2 kW. It is noted that this condition and the sputtering condition or reverse-sputtering condition that will be described below are only examples, and an optimal condition depends on a equipment, a wafer size, a target material or the like. When the sputtering method is used for forming the barrier layer 10, this is referred to as first sputtering for convenience.

Here, the barrier layer 10 is made of, for example, a titanium (Ti) layer, a titanium nitride (TiN) layer, a tantalum (Ta) layer, a tantalum nitride (TaN) layer, a titanium tungsten (TiW) layer, a tungsten nitride (WN) layer, a zirconium (Zr) layer, a zirconium nitride (ZrN) layer or the like. The barrier layer has functions of preventing diffusion of a metal material of a penetrating electrode 16 which is to be formed in the via hole 8, preventing interaction between this metal material and the lower conductor (the pad electrode 3 in this embodiment), enhancing adhesion of the semiconductor substrate 1 and the penetrating electrode 16 which will be described below, or the like. The material of the barrier layer 10 is not particularly limited as long as it has these functions.

The amount of the material of the barrier layer 10 deposited on the bottom of the via hole 8 is smaller than that of the barrier layer 10 deposited on the back surface of the semiconductor substrate 1. When the thickness of the barrier layer 10 formed on the back surface of the semiconductor substrate 1 is about 100 nm, for example, the thickness of the barrier layer 10 formed on the bottom of the via hole 8 is about 10 to 20 nm, although it depends on conditions of a manufacturing device, a manufacturing process, an aspect ratio of the via hole 8 and so on.

Figure 6:
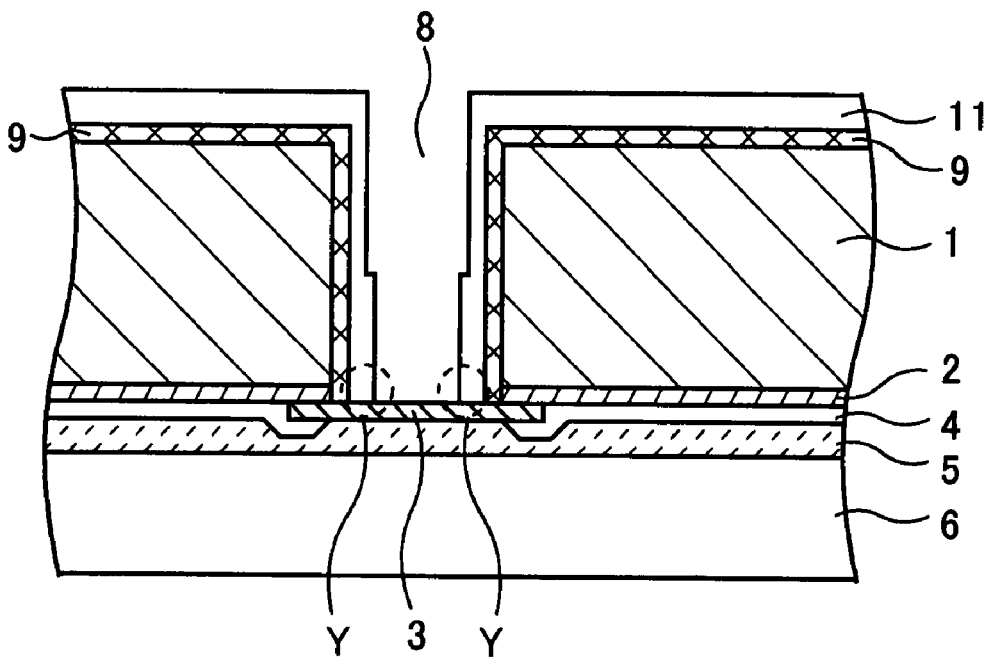

Then, as shown in FIG. 6, reverse-sputtering (etching) is performed to the barrier layer 10 using, for example, argon (Ar) plasma to scatter the material of the barrier layer 10 on the bottom of the via hole 8 therearound. In detail, for example, the reverse-sputtering is performed with single wafer type sputtering equipment under the condition of chamber pressure of 1 Pa, an argon gas flow rate of 10 sccm, RF power of 1 kW, and substrate bias power of 1 kW. As a result, the barrier layer 10 deposited on the bottom of the via hole 8 is partially removed. This reverse-sputtering (etching) is performed until at least a part of the surface of the pad electrode 3 is exposed on the bottom of the via hole 8. It is necessary to take care in a reverse-sputtering condition (time or device power) so as to avoid a defect occurring in the device element formed on the semiconductor substrate 1 due to excess reverse-sputtering.

By this reverse-sputtering, the material of the barrier layer 10 is deposited enough in a position where the deposition of the material is difficult by the first sputtering, that is, on the sidewall of the via hole 8 including in a corner portion Y at the bottom of the via hole 8. The barrier layer after the reverse-sputtering is referred to as a first barrier layer 11 for convenience.

After the reverse-sputtering, the thickness of the first barrier layer 11 formed on the back surface of the semiconductor substrate 1 is about 60 to 70 nm, for example, and the thickness of the first barrier layer 11 formed on the sidewall of the via hole 8 is about 10 to 20 nm, for example. FIG. 6 shows a state where the first barrier layer 11 is not formed on the bottom of the via hole 8 except in the corner Y.

Figure 7:
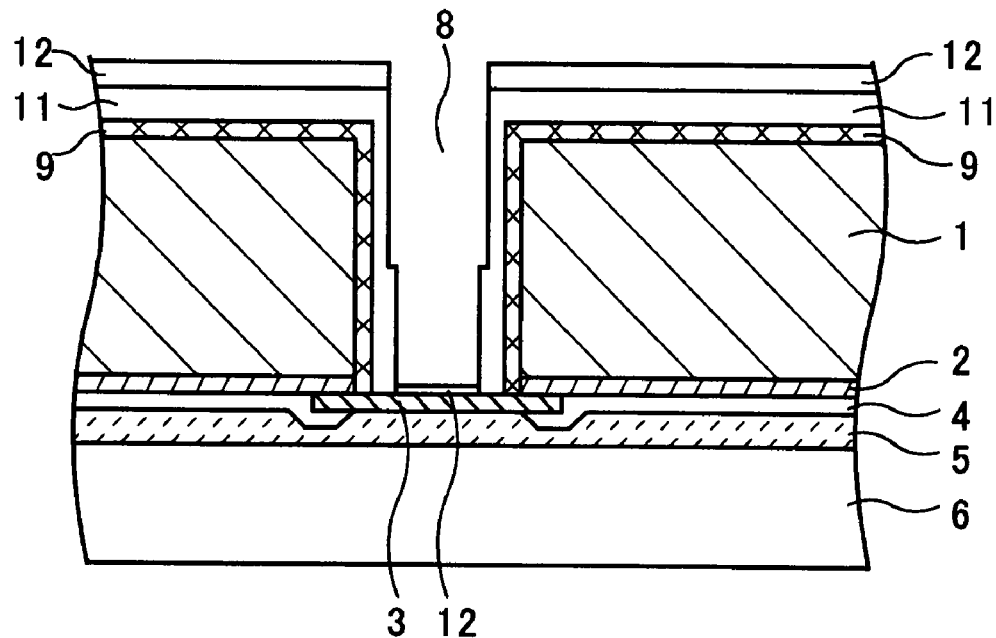

Then, as shown in FIG. 7, a second barrier layer 12 that is made of the same type of material as that of the first barrier layer 11 or a different type of material from that of the first barrier layer 11 is formed in the via hole 8 and on the back surface of the semiconductor substrate 1. The material of the second barrier layer 12 is not particularly limited as long as it has the same functions as the described functions of the barrier layer 10, and may be a single layer or a lamination layer of these. The lamination structure is made of a combination of the above-described materials, for example, a titanium layer/titanium nitride layer.

The second barrier layer 12 covers at least the pad electrode 3 on the bottom of the via hole 8. At this time, although the second barrier layer 12 may be formed by a CVD method, a sputtering method or a PVD method is preferable from an aspect of sequentially forming the second barrier layer 12 in the same chamber for depositing the first barrier layer 11 and minimizing reduction of conductivity and film quality. In detail, for example, the sputtering is performed with single wafer type sputtering equipment under the condition of chamber pressure of 2 Pa, an argon gas flow rate of 10 sccm, and RF power of 2 kW. In a case of using the sputtering method, this is referred to as second sputtering for convenience.

After the second sputtering, the thickness of the second barrier layer 12 formed on the back surface of the semiconductor substrate 1 is about 10 nm, for example, and the thickness of the second barrier layer 12 on the bottom of the via hole 8 is about 1 to 2 nm. Accordingly, the barrier layer including the first and second barrier layers 11 and 12 as a whole is easily provided with the smaller thickness on the bottom of the via hole 8 than on the sidewall of the via hole 8 (e.g. 10 to 20 nm). Since the thickness of the second barrier layer 12 is optional, the whole barrier layer may also have the constant thickness on the bottom and the sidewall of the via hole 8.

Since the surface of the pad electrode 3 is partially exposed by the described reverse-sputtering, the control of via resistance is realized by adjusting only the thickness of the second barrier layer 12 deposited on the bottom of the via hole 8. Furthermore, since the sidewall of the via hole 8 including the corner Y at the bottom of the via hole 8 is already covered with the first barrier layer 11 by the described reverse-sputtering, the whole inner surface of the via hole 8 is fully covered with the material of the barrier layer including the second barrier layer 12.

Figure 8:
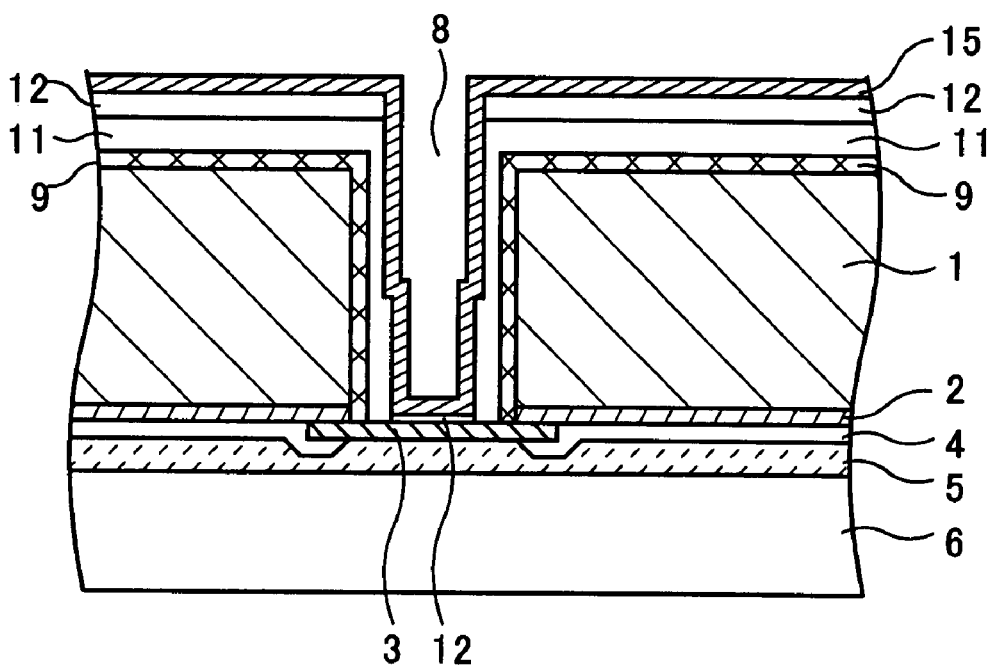

Then, as shown in FIG. 8, a seed layer 15 is formed on the first barrier layer 11 and the second barrier layer 12. The seed layer 15 is a conductive layer serving as a base electrode for forming the penetrating electrode 16 and a wiring layer 17 which will be described below by plating, and made of metal, for example, copper (Cu), ruthenium (Ru), palladium (Pd) or the like. The seed layer 15 is formed by a sputtering method, a PVD method, a CVD method or the other deposition method. In detail, for example, the sputtering is performed with single wafer type sputtering equipment under the condition of chamber pressure of 2 Pa, an argon gas flow rate of 10 sccm, and RF power of 4 kW. The seed layer 15 is about 100 nm in thickness, for example.

Alternatively, the reverse-sputtering may be performed only to the seed layer 15 after the seed layer 15 is formed once. This prevents the seed layer 15 insufficiently covering particularly the bottom of the via hole 8. In a case of performing the reverse-sputtering to the seed layer 15, a reverse-sputtering condition is to be controlled so as to avoid exposing the second barrier layer 12 and leave the seed layer 15 on the whole inner surface of the via hole 8.

Figure 9:
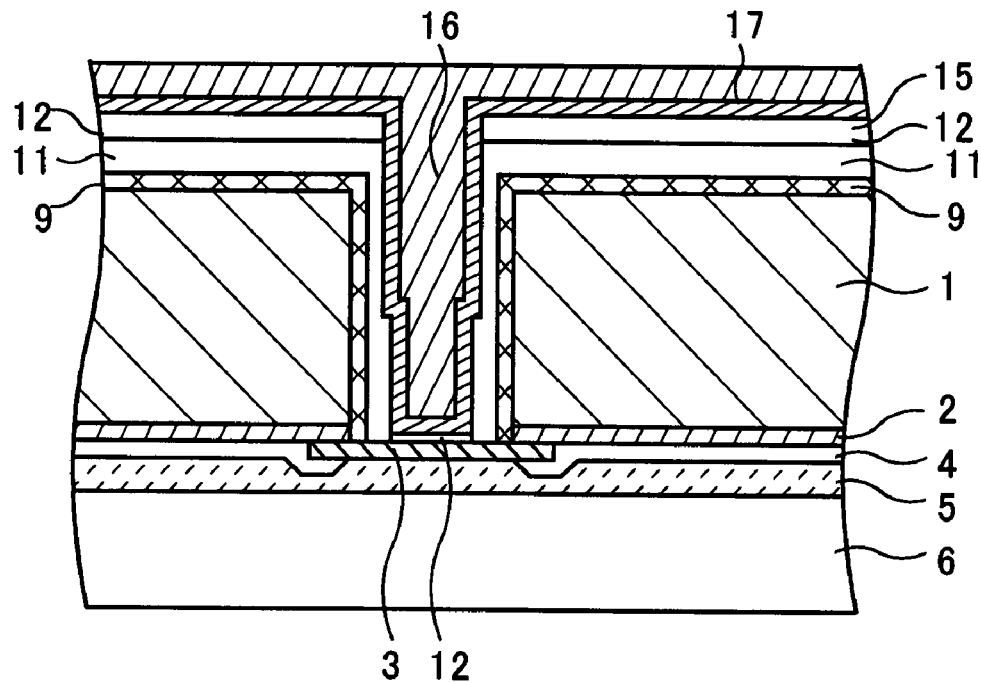

Then, as shown in FIG. 9, the penetrating electrode 16 and the wiring layer 17 continuously connected to the electrode 16, which are made of copper (Cu), are formed on the seed layer 15 including in the via hole 8 by, for example, an electrolytic plating method using the seed layer 15 as a plating electrode. The penetrating electrode 16 mentioned here is a conductive layer formed in the via hole 8. In this embodiment, the wiring layer 17 is an upper conductor, and a conductive terminal 20 which will be described below is also an upper conductor. The penetrating electrode 16 and the wiring layer 17 are electrically connected to the pad electrode 3 on the bottom of the via hole 8 through the first and second barrier layers 111 and 12 and the seed layer 15.

Figure 13:
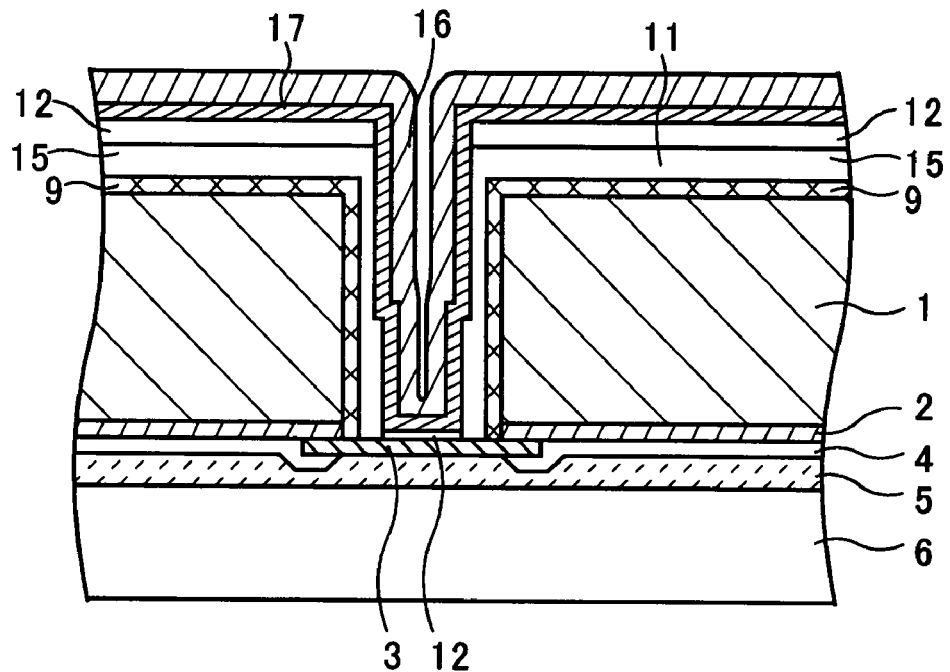
Figure 14:
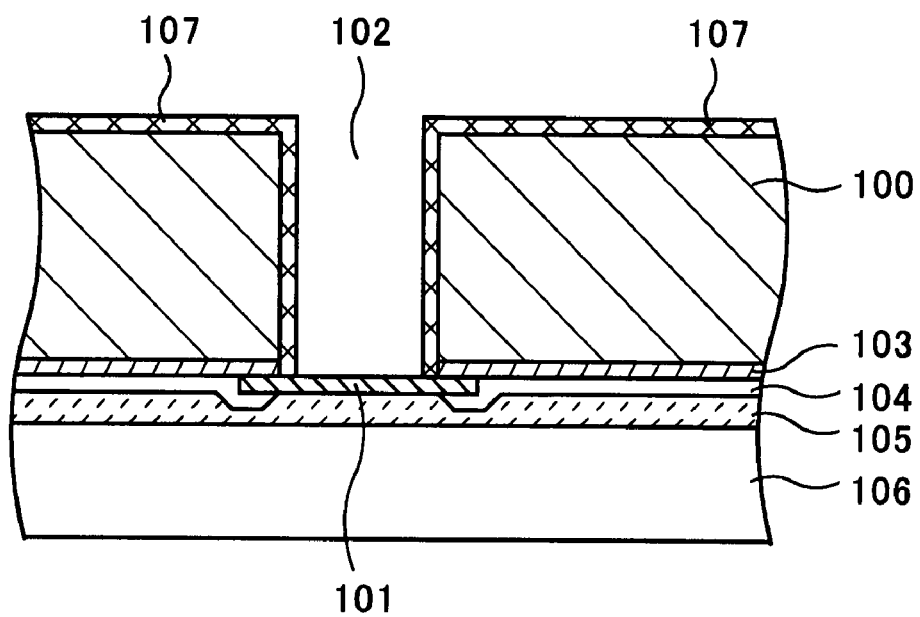
FIGS. 14 to 16 are cross-sectional views for explaining a conventional method of manufacturing a semiconductor device.
Figure 15:
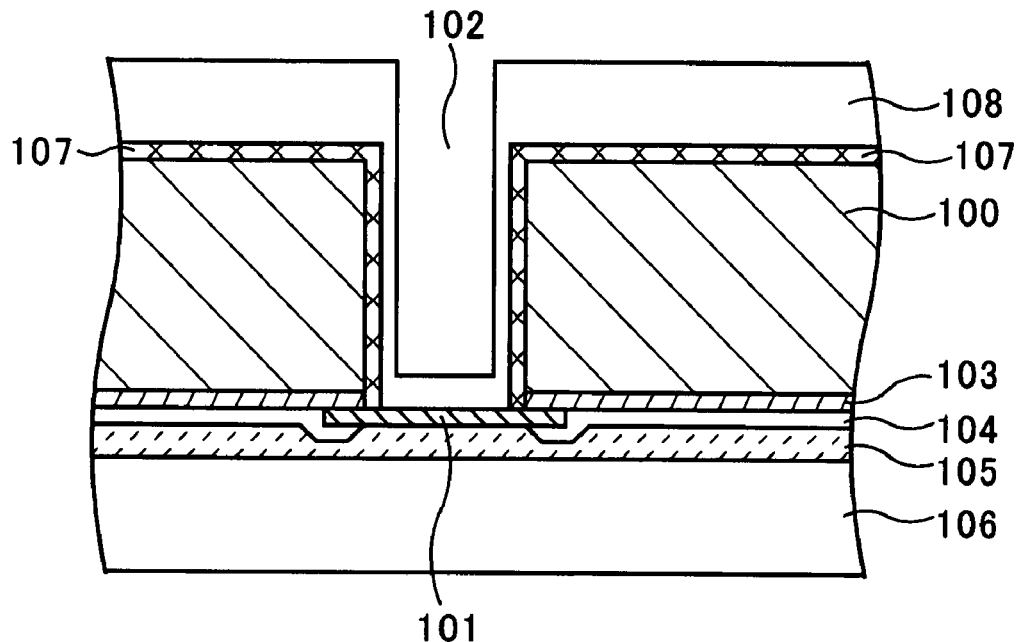
Figure 16:
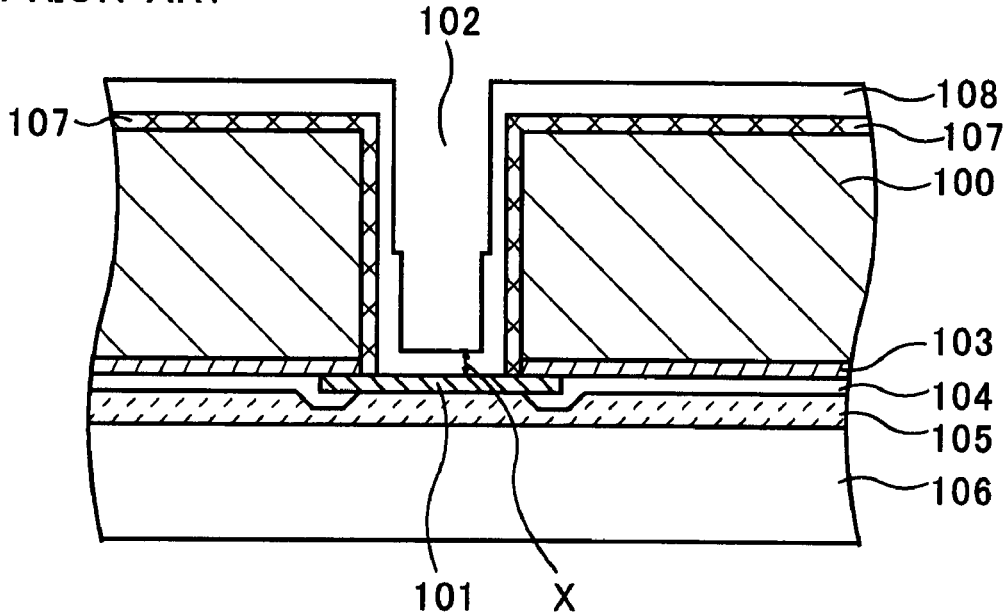

The penetrating electrode 16 does not necessarily fill the via hole 8 completely, and may incompletely fill the via hole 8 as shown in FIG. 13. This structure has advantages of saving a conductive material necessary for forming the penetrating electrode 16 and the wiring layer 17 and increasing a throughput since it takes less time to form the penetrating electrode 16 and the wiring layer 17 than in the case of the complete filling.

Figure 10:
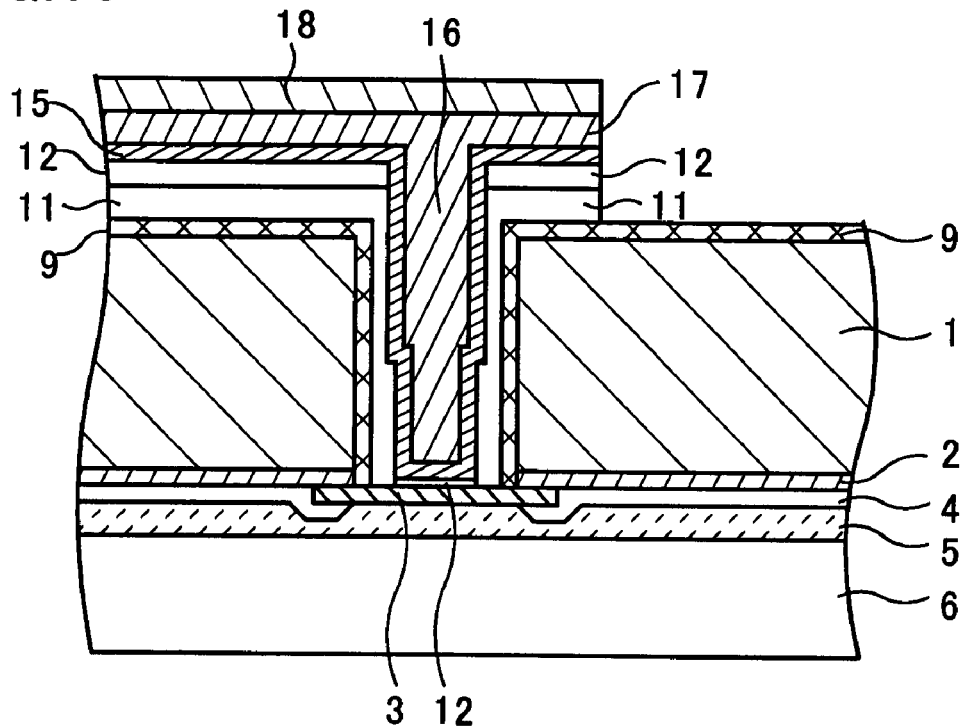

Then, as shown in FIG. 10, a resist layer 18 for forming a wiring pattern is selectively formed on the wiring layer 17 on the back surface of the semiconductor substrate 1. Then, unnecessary portions of the wiring layer 17 and the seed layer 15 are removed by etching using the resist layer 18 as a mask. By this etching, the wiring layer 17 is formed into a predetermined wiring pattern. Then, the first and second barrier layers 11 and 12 formed on the back surface of the semiconductor substrate 1 are selectively removed by etching using the wiring layer 17 as a mask.

The processes of forming the first and second barrier layers 11 and 12, the seed layer 15, the penetrating electrode 16 and the wiring layer 17 are not limited to the above described processes. For example, the wiring layer 17 or the like may be patterned by forming a resist layer or the like on the back surface of the semiconductor substrate 1 in a region where the wiring layer 17 is not to be formed and then forming the wiring layer 17 or the like in a region which is not covered with this resist layer or the like. The resist layer 18 is not necessary in this process.

Figure 11:
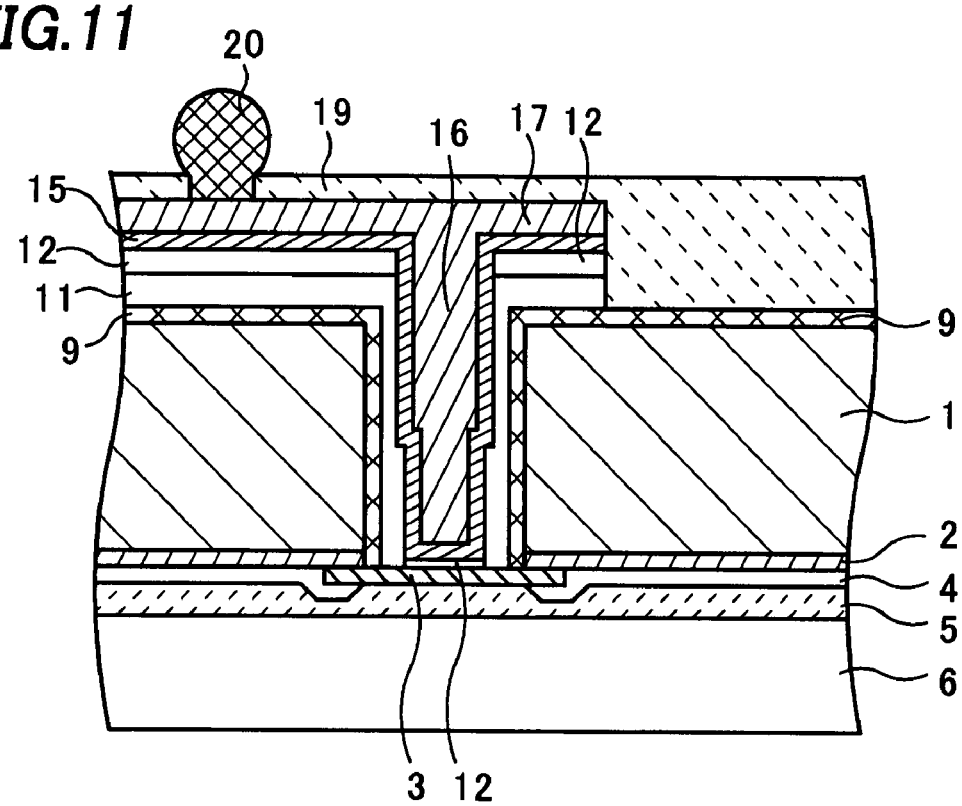

Then, as shown in FIG. 11, a protection layer 19 made of, for example, an organic material such as a solder resist or an inorganic material such as a silicon nitride film is formed on the back surface of the semiconductor substrate 1. An opening is formed in a region of the protection layer 19 where a conductive terminal is to be formed, and an electrode connection layer (not shown) made of nickel (Ni) and gold (Au) is formed on the wiring layer 17 exposed in the opening. Then, a solder is screen-printed on the electrode connection layer and reflowed by a heat treatment, thereby forming the ball-shaped conductive terminal 20.

Alternatively, the so-called dispenser method (a coating method) where a ball-shaped terminal or the like made of a solder or the like is coated with a dispenser, an electrolytic plating method or the like may be used for forming the conductive terminal 20. Alternatively, the conductive terminal 20 may not be formed in the other embodiment. In this case, the electrode connection layer or the wiring layer 17 is exposed in the opening of the protection layer 19 and the electrode connection layer or the wiring layer 17 is connected to an electrode of the other device.

The supporting body 6 may be left attached on the semiconductor substrate 1, or removed from the semiconductor substrate 1 and reused.

The chip size package type semiconductor device having the wiring from the lower conductor (the pad electrode 3) formed on the front surface of the semiconductor substrate 1 to the upper conductor (the wiring layer 17 and the conductive terminal 20) formed on the back surface thereof through the via hole 8 is thus completed by these processes. When this semiconductor device is mounted on electronic equipment, the device is electrically connected to an external circuit by mounting the conductive terminal 20 on a wiring pattern on a circuit board.

Accordingly, since the barrier layer or both the barrier layer and the seed layer in the via hole 8 is covered well in this embodiment, the reliability of the semiconductor device is enhanced. At the same time, since the ultimate thickness of the barrier layer on the bottom of the via hole is adjusted by one deposition process, the via resistance is controlled more easily and smaller than conventional. Furthermore, since the barrier layer with enhanced coverage is formed without using the CVD method in this embodiment, the manufacturing cost is reduced.

Although the description of the above embodiment is given on the BGA (Ball Grid Array) type semiconductor device having the ball-shaped conductive terminal 20, the invention is also applicable to semiconductor devices of other types such as LGA (Land Grid Array) type, CSP (Chip Size Package) type and flip-chip type that have no ball-shaped conductive terminals.

Next, a second embodiment of the invention will be described referring to figures. In the second embodiment, the invention is applied to a vertical transistor where a current flows mainly in a vertical direction of a semiconductor substrate.

Figure 17:
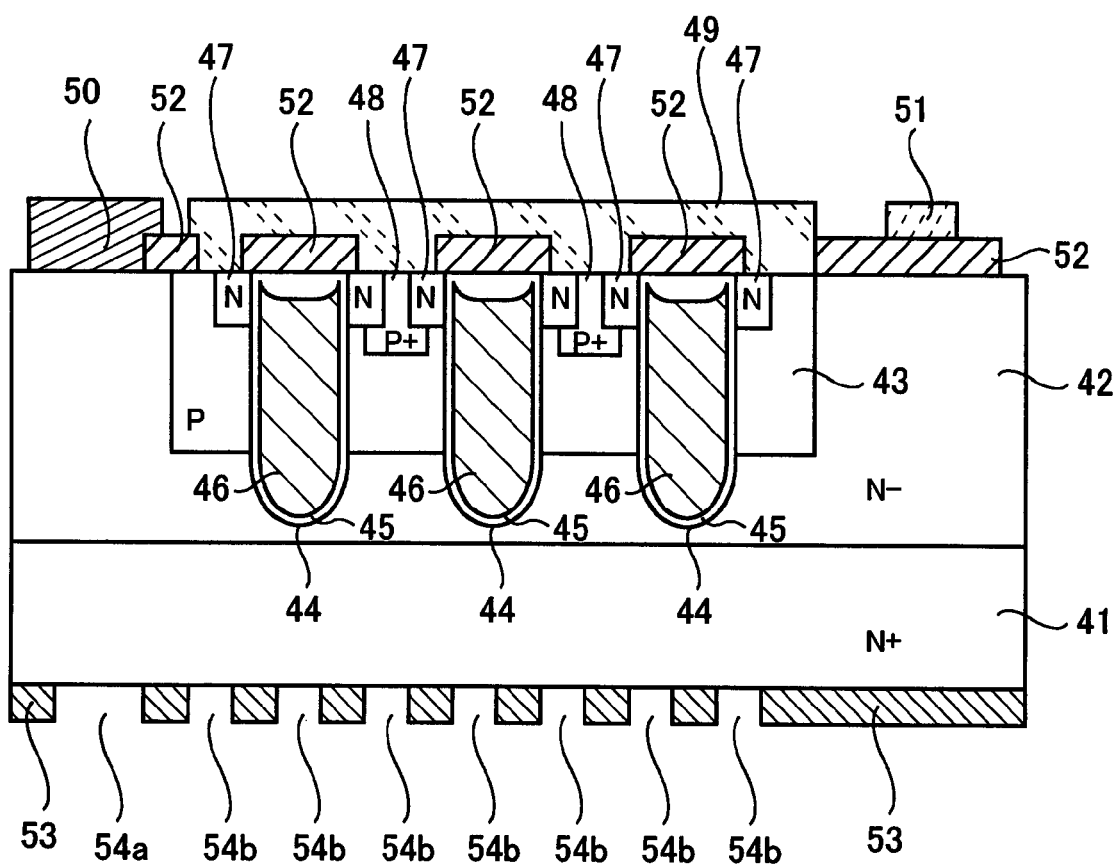
FIGS. 17, 18 and 20 are cross-sectional views for explaining a semiconductor device and a method of manufacturing the same of a second embodiment of the invention.

As shown in FIG. 17, an N$^-$-type epitaxial layer 42 is formed on a semiconductor substrate 41 made of, for example, N$^+$-type silicon, and a P-type diffusion layer 43 (a channel region) is formed in a surface of this epitaxial layer 42. The thickness of the epitaxial layer 42 is 10 μm, the thickness of the semiconductor substrate 41 is 200 μm including the thickness of the epitaxial layer 42, and the thickness of the P-type diffusion layer 43 is 1 to 1.5 μm, for example.

Trench grooves 44 are formed from the surface of the P-type diffusion layer 43 to a predetermined depth position of the epitaxial layer 42. The depth of the trench groove 44 is 2 μm and the opening diameter thereof is 0.4 μm, for example. Gate insulation films 45 are formed on the inner surfaces of the trench grooves 44, and gate electrodes 46 made of, for example, polysilicon films are formed in the trench grooves 44 with the gate insulation films 45 interposed therebetween respectively.

N+-type source layers 47 are formed adjacent to the trench grooves 44 and the gate insulation films 45 in the surface of the epitaxial layer 42. P+-type body layers 48 are respectively formed between and over the adjacent source layers 47. A source electrode 49 made of, for example, an aluminum alloy or the like is formed on the P-type diffusion layer 43 so as to cover the source layers 47 at least partially.

A drain terminal 50 and a gate terminal 51 made of, for example, an aluminum alloy or the like are formed on the epitaxial layer 42. The drain terminal 50 is a terminal for leading a drain current from a drain electrode 56 that will be described below. The gate terminal 51 is a terminal connected with the gate electrodes 46 through a wiring (not shown). An insulation film 52 made of a silicon oxide film or the like is formed on the gate electrodes 46 and on predetermined regions of the P-type diffusion layer 43 and the epitaxial layer 42.

Then, a resist layer 53 is selectively formed on the back surface of the semiconductor substrate 41. The resist layer 53 is formed so as to have openings 54a and 54b in positions corresponding to the drain terminal 50, the gate electrodes 46 and the source layers 47. In this embodiment, the opening 54a is designed so as to have a larger diameter than the openings 54b, and the diameter of the opening 54a is about 60 μm and the diameter of each of the openings 54b is about 20 μm, for example.

Figure 18:
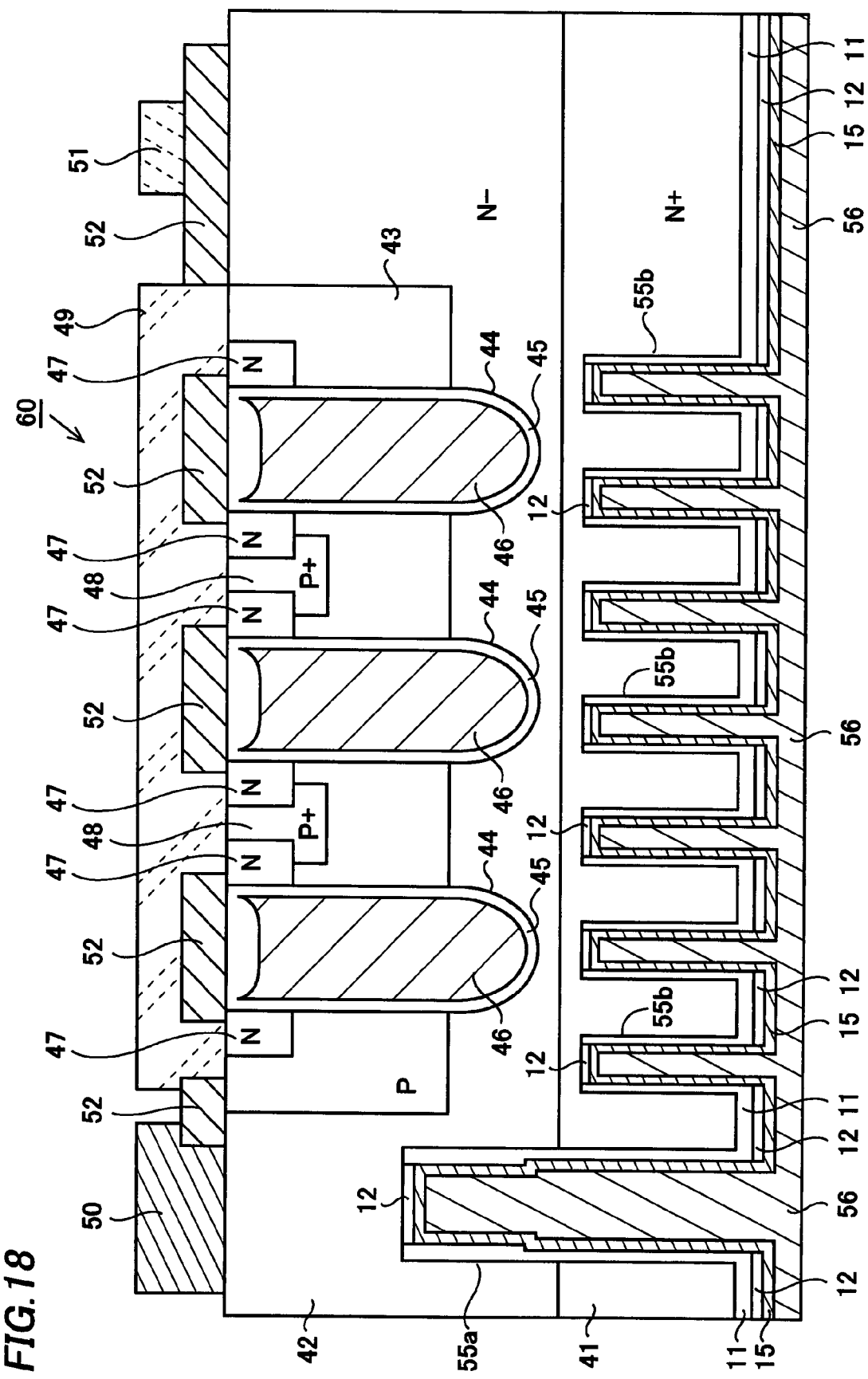
Figure 19A:
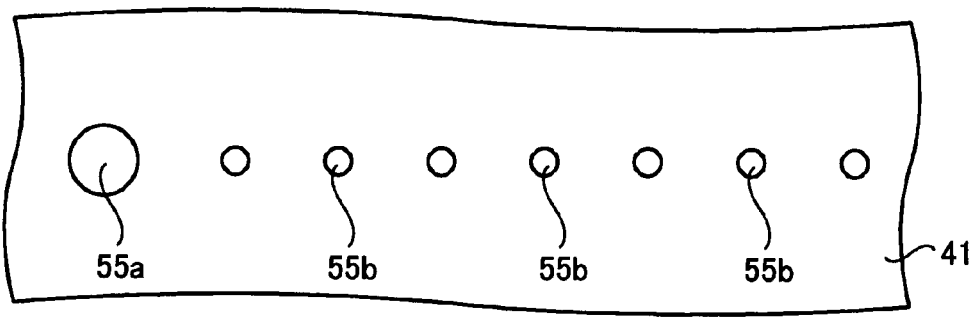
FIGS. 19A to 19D are plan views for explaining the semiconductor device and the method of manufacturing the same of the second embodiment of the invention.
Figure 19B:
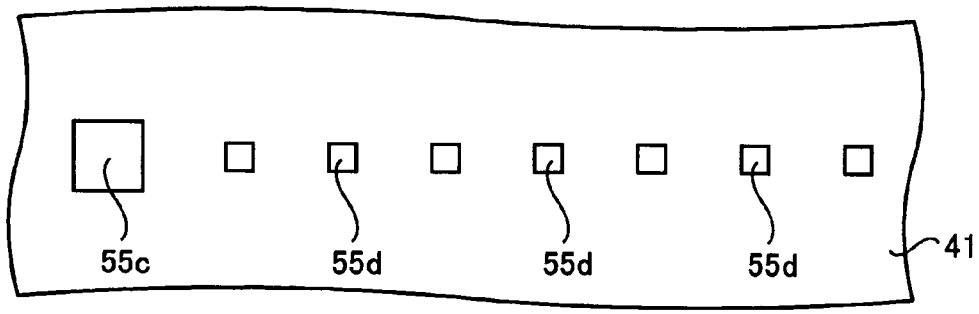
Figure 19C:
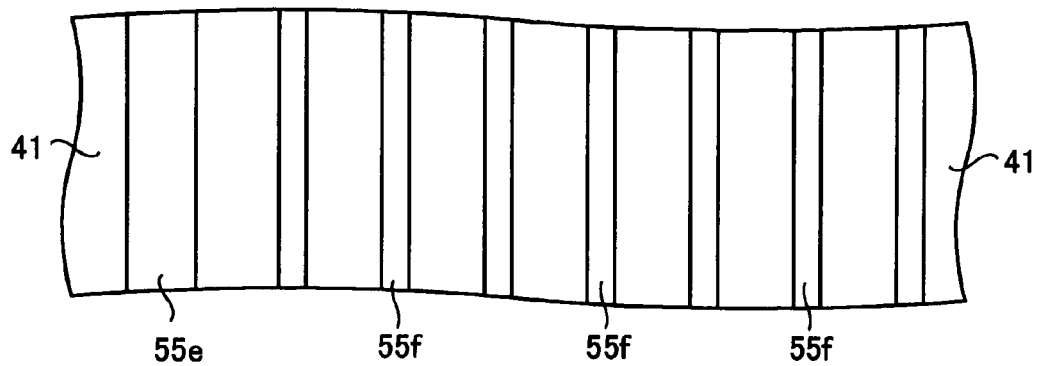
Figure 19D:
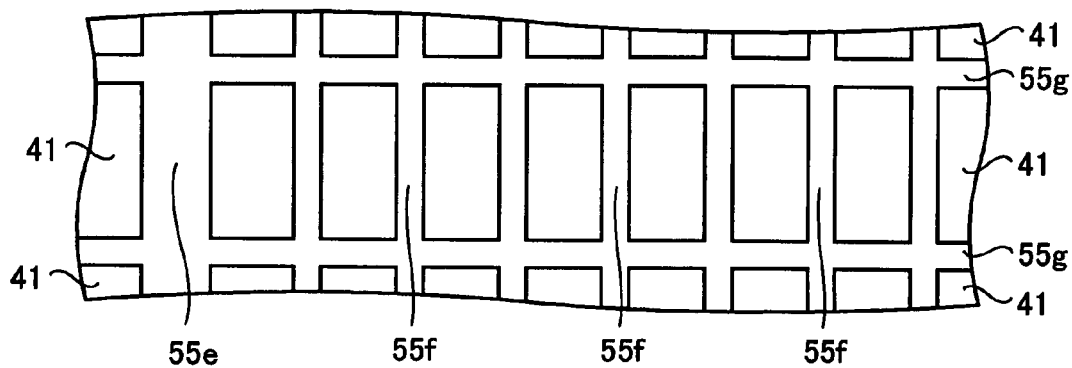

Then, the semiconductor substrate 41 is etched from its back surface to its front surface using the resist layer 53 as a mask to form via holes 55a and 55b as shown in FIG. 18. The via holes 55a and 55b respectively have bottoms in the middle of the thickness of the semiconductor substrate 41 without penetrating the semiconductor substrate 41. The via holes 55a and 55b in a plan view on the back surface side of the semiconductor substrate 41 may form circles respectively as shown in FIG. 19A, squares like via holes 55c and 55d as shown in FIG. 19B, slit-like shapes like via holes 55e and 55f as shown in FIG. 19C, or a crossing shape of slit-like via holes 55e, 55f and 55g as shown in FIG. 19D, and there is no limitation in the shape. It is noted that FIGS. 19A, 19B, 19C and 19D are schematic plan views showing only the relations of the via holes and the semiconductor substrate 41. Although FIGS. 19A and 19B show the via holes 55a, 55b, 55c and 55d in a line, the positions of the via holes may also be changed or a number of via holes may also be disposed in a matrix.

By performing etching using the described resist layer 53 having different openings 54a and 54b as a mask, the via holes 55a and 55b having different depths are formed as shown in FIG. 18. In this embodiment, the via hole 55a is formed in a position corresponding to the drain terminal 50, and the via holes 55b are formed shallower than the via hole 55a in positions corresponding to the source electrode 49 and the gate electrodes 46. This is due to a microloading effect in etching. That is, as the diameter of the opening is larger, etching gas enters the hole more easily, residues occurring in the etching are discharged more easily, and an etching speed is more increased. Therefore, it is preferable to form the via holes 55a and 55b by one etching process at the same time. A via hole is not necessary under the gate terminal 51 since a drain current path is not formed under the gate terminal 51.

Then, the first barrier layer 11, the second barrier layer 12 and the seed layer 15 are formed in the via holes 55a and 55b and on the back surface of the semiconductor substrate 41 by the same processes as those of the first embodiment. Then, a drain electrode 56 is formed in the via holes 55a and 55b and on the back surface of the semiconductor substrate 41 by the same process as the process for forming the penetrating electrode 16 and the wiring layer 17 of the first embodiment. The drain electrode 56 does not necessarily fill the via holes 55a and 55b completely, and may incompletely fill the via holes 55a and 55b.

A vertical MOS transistor 60 of the second embodiment is thus formed. Since the source electrode 49, the drain terminal 50 and the gate terminal 51 are formed on the same surface, facedown packaging of the vertical MOS transistor 60 is realized.

In the MOS transistor 60, when a predetermined voltage is applied to the source electrode 49, the drain terminal 50 and the gate terminal 51, channels are formed along the gate electrodes 46 in the P-type diffusion layer 43, and a current flows from the drain terminal 50 to the source layers 47 and the source electrode 49 through the drain electrode 56, the semiconductor substrate 41, the epitaxial layer 42 and the P-type diffusion layer 43.

While the P-type diffusion layer 43 is not formed under the drain terminal 50, the drain electrode 56 extends adjacent to the drain terminal 50 due to the formation of the via hole 55a. Therefore, even if the drain electrode 56 does not contact the drain terminal 50, resistance therebetween is low and the drain electrode 56 and the drain terminal 50 are electrically connected. Accordingly, a drain current is easily led from the drain electrode 56 to the drain terminal 50.

As described above, in the second embodiment, the via holes 55a and 55b are formed without penetrating the substrate. In this embodiment, the same effect as that of the first embodiment is obtained in the via holes 55a and 55b which do not penetrate the substrate. Therefore, both the prevention of the barrier layer insufficiently covering the via holes 55a and 55b and the control of via resistance are achieved at the same time.

Figure 20:
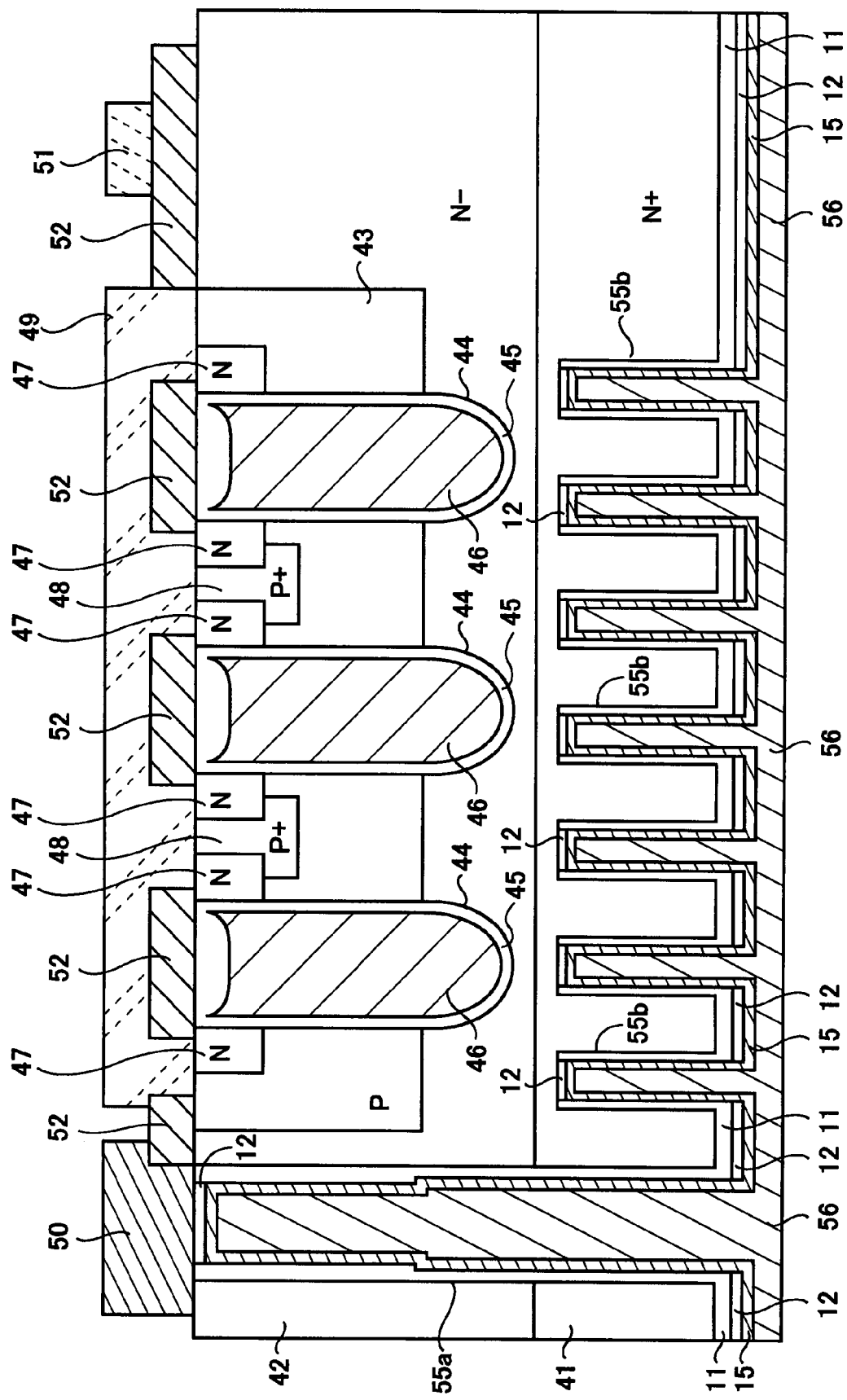

Although the via hole 55a in the MOS transistor 60 (FIG. 18) of the second embodiment is formed extending only to the middle of the epitaxial layer 42 without penetrating the semiconductor substrate 41, it may be formed penetrating the epitaxial layer 42 and contacting the drain terminal 50 as shown in FIG. 20. With this structure, a drain current is led from the drain electrode 56 to the drain terminal 50 more effectively. Although not shown, there is also a case where an insulation film similar to the second insulation film 9 mentioned in the first embodiment is formed on the sidewalls of the via holes 55a and 55b. Accordingly, the invention is applicable to both the cases of the via hole penetrating the substrate and the via hole not penetrating the substrate.

The invention is not limited to the above embodiments and includes such modifications at to be readily apparent to those skilled in the art.

Figure 12:
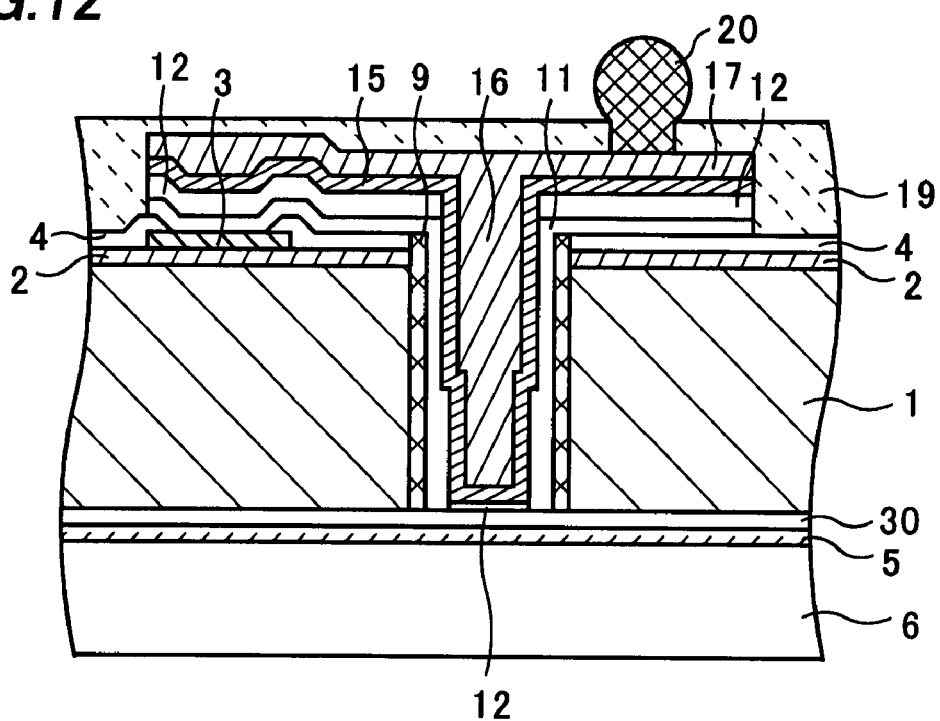

For example, although the supporting body is attached on the front surface side (the surface formed with the element) of the semiconductor substrate 1 in the first embodiment, the supporting body 6 may also be attached on the other side (the surface not formed with the element) for forming the desired semiconductor device as shown in FIG. 12. In this semiconductor device, the pad electrode 3, the wiring layer 17, the conductive terminal 20 or the like are formed on the front surface side (the surface formed with the element) of the semiconductor substrate 1. When this semiconductor device is mounted on electronic equipment, the device is electrically connected to an external circuit by mounting the conductive terminal 20 on a wiring pattern on a circuit board. Furthermore, layering semiconductor devices is achieved by removing the supporting body 6, then forming an opening in an insulation film 30 (e.g. a silicon oxide film formed by a CVD method) in a position corresponding to the penetrating electrode 16 on the back surface of the semiconductor substrate 1, and connecting the opening with a conductive terminal of the other semiconductor device. In this case, the conductive terminal 20 shown in FIG. 12 and the conductive terminal of the other semiconductor device serve as corresponding conductors, and the electrical connection of both the conductors is achieved through the via hole.

It is noted that the same reference numerals are provided for the same components as those described above and description thereof is omitted in FIG. 12. In this manner, the supporting body may be attached on either surface of the semiconductor substrate.

Furthermore, although the pad electrode 3 is provided as the lower conductor in the described first embodiment, a diffusion layer of impurity ions may be provided as the lower conductor. In detail, for example, the diffusion layer is formed in the surface of the semiconductor substrate by ion-implantation, a via hole is provided in the insulation film deposited on the surface of the semiconductor substrate, the via hole reaching the diffusion layer, and the invention is applied to the formation of the barrier layer or the seed layer in this via hole. Furthermore, although the description of the second embodiment is given on the transistor having the trench grooves, the invention is also applicable to a transistor having the other structure. The invention is effectively applicable to a transistor having no trench groove and having a gate electrode on a surface of a semiconductor substrate or a transistor where a current flows in a vertical direction of a semiconductor substrate such as an insulated gate bipolar transistor (IGBT). The IGBT is a transistor in which a fundamental cell combines a bipolar transistor and a MOS transistor, having both low on-voltage characteristics of the bipolar transistor and voltage drive characteristics of the MOS transistor. The invention is widely applicable to a semiconductor device having a via hole.

As described above, the barrier layer on the bottom of the via hole is partially removed by reverse-sputtering once, and then the barrier layer is formed on the bottom of the via hole by one deposition process. Therefore, the thickness of the barrier layer on the bottom of the via hole and the via resistance are easily controlled. Both the prevention of the barrier layer insufficiently covering the via hole and the reduction of the via resistance are achieved at the same time.

What is claimed is:

1. A semiconductor device comprising:
    a semiconductor substrate having a first surface and a second surface opposite from the first surface;
    a first conductor disposed on the first surface of the semiconductor substrate;
    a second conductor disposed on the second surface of the semiconductor substrate;
    a via hole penetrating through the semiconductor substrate and connecting the first conductor and the second conductor;
    a barrier layer disposed in the via hole; and
    a penetrating electrode disposed on the barrier layer in the via hole so as to electrically connect the first and second conductors,
    wherein the barrier layer comprises a first conducting barrier layer formed on an inner sidewall of the via hole and a second conducting barrier layer formed at a bottom end of the via hole,
    the first conducting barrier layer comprises an upper wall portion and a lower wall portion that are disposed on the inner sidewall of the via hole, and the lower wall portion is thicker than the upper wall portion and located at the bottom end of the via hole,
    the bottom end of the via hole is located on the side of the first surface of the semiconductor substrate,
    the first and second conducting barrier layers are disposed on the second surface of the semiconductor substrate so that the first conducting barrier layer is between the second conducting barrier layer and the second surface of the semiconductor substrate, and
    the second conducting barrier layer is, at least partially, physically in contact with the first conductor such that the whole bottom end of the via hole is covered by the barrier layer.

2. The semiconductor device of claim 1, further comprising a seed layer formed on the second conducting barrier layer.

3. The semiconductor device of claim 1, wherein the total thickness of the first and second conducting barrier layers is constant at the bottom end and on the sidewall of the via hole.

4. The semiconductor device of claim 1, further comprising a supporting body attached to the first surface or the second surface of the substrate.

5. The semiconductor device of claim 1, wherein the second conducting barrier layer comprises a material different from a material of the first conducting barrier layer.

6. The semiconductor device of claim 1, wherein the second conducting barrier layer comprises laminated layers.

7. The semiconductor device of claim 1, wherein a thickness of the second conducting barrier layer at the bottom end of the via hole is smaller than a thickness of the second conducting barrier layer on the second surface of the semiconductor substrate.

8. The semiconductor device of claim 1, wherein the second conducting barrier layer is not formed on the first conducting barrier layer formed on the inner sidewall of the via hole except at the bottom end of the via hole.

9. The semiconductor device of claim 1, wherein the total thickness of the first and second conducting barrier layers is smaller at the bottom end of the via hole than on the sidewall of the via hole.

* * * * *